United States Patent
Ebihara et al.

(10) Patent No.: US 11,240,456 B2
(45) Date of Patent: Feb. 1, 2022

(54) COLUMN AMPLIFIER RESET CIRCUIT

(71) Applicant: OmniVision Technologies, Inc., Santa Clara, CA (US)

(72) Inventors: Hiroaki Ebihara, Santa Clara, CA (US); Zheng Yang, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 295 days.

(21) Appl. No.: 16/441,674

(22) Filed: Jun. 14, 2019

(65) Prior Publication Data
US 2020/0396403 A1    Dec. 17, 2020

(51) Int. Cl.
*H04N 5/378* (2011.01)
*H04N 5/365* (2011.01)
*H04N 5/3745* (2011.01)
*H01L 27/146* (2006.01)

(52) U.S. Cl.
CPC .......... *H04N 5/378* (2013.01); *H04N 5/3658* (2013.01); *H04N 5/37455* (2013.01); *H01L 27/14609* (2013.01); *H01L 27/14643* (2013.01)

(58) Field of Classification Search
CPC ... H04N 5/378; H04N 5/3658; H04N 5/37455
See application file for complete search history.

(56) References Cited

U.S. PATENT DOCUMENTS

| | | | | |
|---|---|---|---|---|
| 6,788,125 B1* | 9/2004 | Tomsio | .......... | H03K 19/018521 327/333 |
| 9,554,071 B2 | 1/2017 | Panicacci | | |
| 9,693,001 B2 | 6/2017 | Kim et al. | | |
| 2009/0128232 A1* | 5/2009 | Deng | .......... | H03F 3/005 330/9 |
| 2009/0273392 A1* | 11/2009 | Korobeynikov | .......... | H03K 5/24 327/551 |
| 2014/0008515 A1* | 1/2014 | Wang | .......... | H03M 1/145 250/208.1 |
| 2015/0365616 A1* | 12/2015 | Yoshida | .......... | H03M 1/129 348/300 |
| 2019/0123691 A1* | 4/2019 | Puttananjegowda | .. | G01N 33/49 |

FOREIGN PATENT DOCUMENTS

TW    I650022 B    2/2019

OTHER PUBLICATIONS

Taiwanese Office Action dated Sep. 7, 2021, issued in corresponding Taiwan Application No. TW 109119069, filed Jun. 5, 2020, 36 pages.

* cited by examiner

*Primary Examiner* — Thanh Luu
(74) *Attorney, Agent, or Firm* — Christensen O'Connor Johnson Kindness PLLC

(57) ABSTRACT

An amplifier circuit for use in an image sensor includes a common source amplifier coupled to receive an input signal representative of an image charge from a pixel cell of the image sensor. An auto-zero switch is coupled between an input of the common source amplifier and an output of the common source amplifier. A feedback capacitor is coupled to the input of the common source amplifier. An offset switch is coupled to the feedback capacitor and is further coupled to a reset voltage and an output of the amplifier circuit. The auto-zero switch and the offset switch are configured to couple the feedback capacitor to the reset voltage during a reset of the amplifier circuit. The offset switch is configured to couple the feedback capacitor to the output of the amplifier circuit after the reset of the amplifier circuit.

21 Claims, 9 Drawing Sheets

COLUMN AMPLIFIER RESET CIRCUIT

BACKGROUND INFORMATION

Field of the Disclosure

This disclosure relates generally to image sensors, and in particular but not exclusively, relates to column amplifier circuits for use with analog to digital conversion circuitry in an image sensor.

Background

Image sensors have become ubiquitous. They are widely used in digital still cameras, cellular phones, security cameras, as well as medical, automobile, and other applications. The technology used to manufacture image sensors has continued to advance at a great pace. For example, the demands of higher resolution and lower power consumption have encouraged the further miniaturization and integration of these devices.

Image sensors conventionally receive light on an array of pixels, which generates charge in the pixels. The arrays of pixels are often arranged into a plurality of rows and a plurality of columns. The intensity of the light may influence the amount of charge generated in each pixel, with higher intensity generating higher amounts of charge. The charge information are often read out from the array of pixels through column bitlines. Analog to digital converters (ADCs) are often used in CMOS image sensors (CIS) to convert the charge information from a pixel received through a column amplifier into a digital representation of the charge by the image sensor. The ADCs generate the digital representations of the charge based on a comparison of an image charge signal to a reference voltage signal. The reference voltage signal may conventionally be a ramp signal provided by a ramp generator and the comparison may conventionally be performed by a comparator, which provides an output that can be used with a counter to generate the digital representation of the image charge from the pixel.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 2:
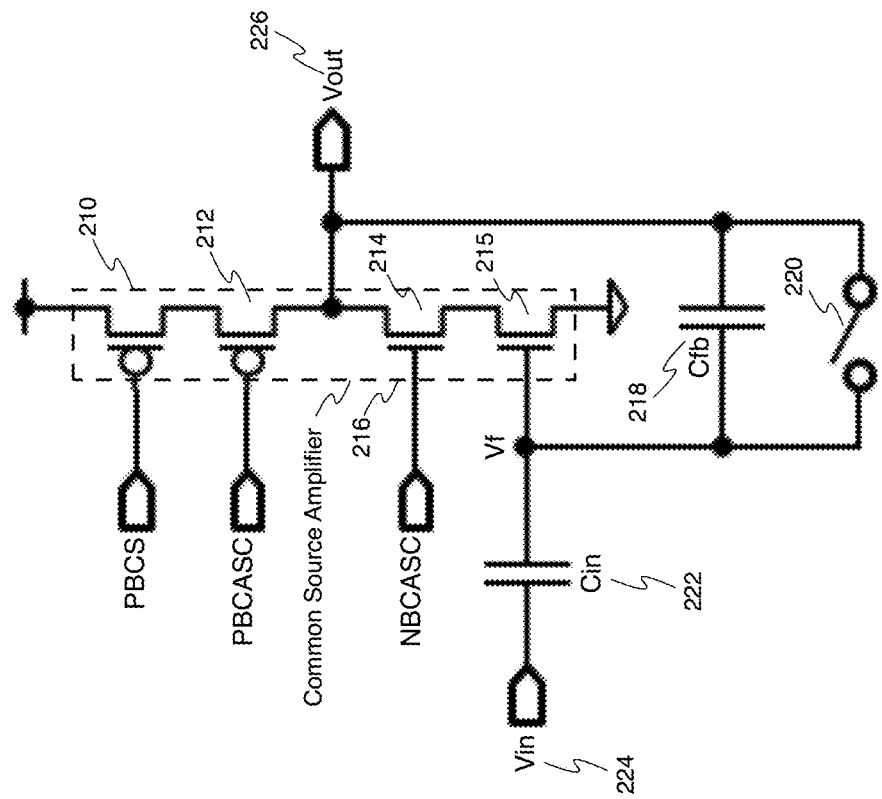
FIG. 2 illustrates an example schematic of column amplifier for use in an image sensor.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to a column amplifier reset circuit are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
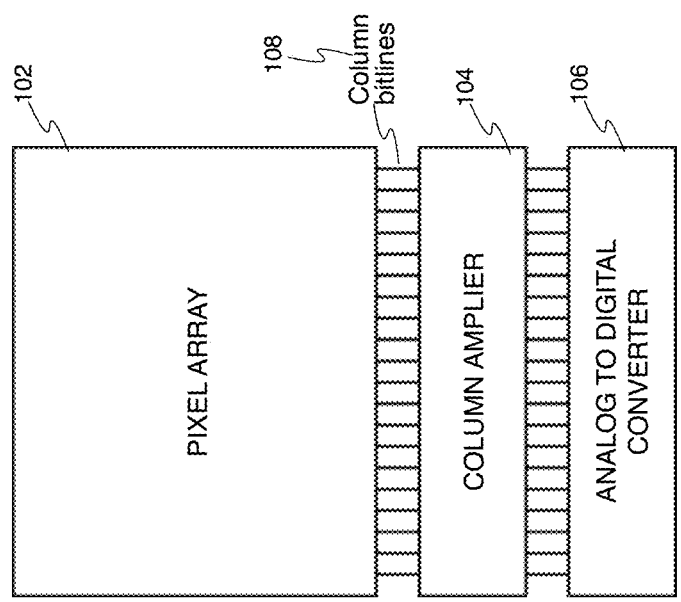
FIG. 1 illustrates one example of an imaging system in accordance with the teachings of the present invention.

FIG. 1 illustrates one example of an imaging system 100 in accordance with an embodiment of the present disclosure. In one example, imaging system 100 is a complementary metal oxide semiconductor (CMOS) image sensor and includes a pixel array 102, column amplifier circuitry 104, and analog to digital converter (ADC) circuitry 106. In one example, pixel array 102 is a two-dimensional (2D) array of photodiodes or image sensor pixels. As illustrated, photodiodes are arranged into a plurality of rows and a plurality of columns to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image charge information from the pixels are read out from pixel array 102 through column bitlines 108 and column amplifier circuitry 104. The ADC circuitry 106 is coupled to receive the charge information from the pixels of pixel array 102 through column amplifier circuitry 104 to convert the charge information into a digital representation of the charge by the image sensor 100. As will be discussed, in various examples, the column amplifier circuitry 104 includes column amplifier reset circuitry in accordance with teachings of the present invention. In one example, the ADC circuitry 106 generates the digital representations of the charge based on a comparison of an image charge signal to a reference voltage signal.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

FIG. 2 illustrates one example schematic of column amplifier 204 that may be included in a CMOS image sensor, such as for example image sensor 100 of FIG. 1. In the depicted example, column amplifier 204 includes a common source amplifier 216, a feedback capacitor 218 and an input capacitor 224. The common source amplifier 216 includes an input device 215. In one example, input device 215 is a transistor with a gate terminal coupled to receive an input voltage Vin 224 through an input capacitor Cin 222. In one example, input device 215 is a source follower coupled transistor. In one example, the input voltage Vin 224 is representative of the image charge from a pixel cell of in the pixel array of the image sensor. Input device 215 is coupled to an NMOS cascode device 214, which is coupled to PMOS cascode device 212, which is coupled to current source device 210 as shown. Current source device 210 is coupled to be biased with a bias signal PBCS, PMOS cascode device 212 is coupled to be biased with a bias signal PBCASC, and NMOS cascode device 214 is coupled to be biased with a bias signal NBCASC. Output voltage Vout 226 is generated at a node between the NMOS cascode device 214 and PMOS cascode device 212. Input device 215 is coupled to receive a feedback voltage or floating node voltage Vf from Vout 226 through feedback capacitor Cfb 218. A switch 220 is also coupled between an input terminal of input device 215 and Vout 226 to zero the column amplifier 204.

It is appreciated that the example column amplifier 204 shown in FIG. 2 is a single ended common source amplifier, which is good for a column amplifier because of its small power consumption and small size. In this architecture, it is appreciated that output voltage Vout 226 should be in certain range to keep open loop gain high enough. In the example, the input device 215, NMOS cascode device 214, PMOS cascode device 210, and current source device 210 are configured to operate in a deep saturation region for open loop gain. If the output voltage Vout 226 is too low, the drain source voltage Vds of the input device 215 and/or cascode devices need to be low and so the output conductance gds of those devices can be increased. As a result, open loop gain of the amplifier can be decreased. The open loop gain (dc) of the column amplifier 204 can be given with equation (1) below:

$$A \approx -\frac{gmni}{gdsni\frac{gdsncc}{gmncc} + gdspcs\frac{gdspcc}{gmpcc}} \quad (1)$$

where gmni is the transconductance of the input device 215, gdsni is output conductance of the input device 215, gmncc is the transconductance of the NMOS cascode device 214, gdsncc is output conductance of the NMOS cascode device 214, gmpcc is the transconductance of the PMOS cascode device 212, gdspcc is output conductance of the PMOS cascode device 212, gmpcs is the transconductance of the current source device 210, and gdspcs is output conductance of the current source device 210.

Figure 3:
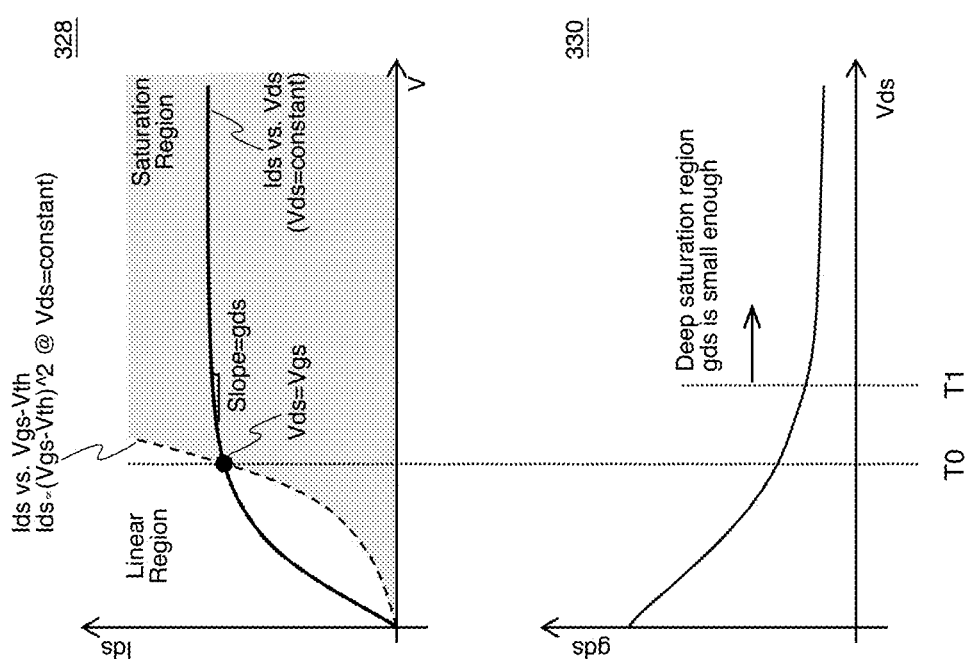
FIG. 3 illustrates an example of IV characteristics of a MOS transistor in a column amplifier for use in an image sensor.

To illustrate, FIG. 3 shows an example of IV characteristics of a MOS transistor that may be included for instance in a column amplifier for use in an image sensor. The top graph 328 shows the relationships of current Ids vs. Vds (solid line) and Ids vs. Vgs-Vth (dashed line), and the bottom graph 330 shows the relationship of gds vs. Vds. As can be observed, the gain "A" can be larger when transconductance of each of the devices is higher compared with the output conductance. Typically, in the linear region or in saturation close to linear region, output conductance gds is large. Short channel effect is not significant in thick oxide devices used for analog circuits, such as the column amplifier 204. In such devices, the output conductance gds gets smaller by increasing the drain source voltage Vds high enough (e.g., >100 mV or more) than the difference between the gate source voltage Vgs and threshold voltage Vth (e.g., "Vgs−Vth"). In this disclosure, the region in which output conductance gds is low enough is referred to as "deep saturation region".

In deep saturation region, ratio between gm and gds can be several hundred times typically. As such, the open loop gain A of the column amplifier 204 shown in FIG. 2 can be around 80~100 dB, which is high enough to realize 18 dB of closed loop gain. However, when operating point of one of those devices approaches linear region, the open loop gain will be decreased because gds of that device is increased. For example, if the operating point of NMOS cascode 214 is in the saturation region, but is close to linear region, "gdsncc" can be higher than 1/100 of "gmncc" and the open loop gain can be decreased to 60~80 dB. In addition, in linear region, gds can be close to gm. When the output voltage Vout 226 of the column amplifier 204 is lower and the cascode device goes into linear region, "gdsncc" and "gmncc" becomes similar order and so gain is reduced significantly. In this condition, the gain of the column amplifier 204 may be just determined by "gmni/gdsni", which may be roughly 40 dB. If the output voltage Vout 226 is further decreased, the operating point of the input device 215 may be close to linear region or go into linear region, and the open loop gain can be reduced to less than 40 dB in accordance with the "gmni/gdsni" ratio.

One challenge is that if the threshold voltage Vth of the input device 215 is low, it is difficult to keep the open loop gain of the common source amp high enough because the reset (auto-zero) voltage of the column amplifier 204 depends on threshold voltage Vth of the input devices. In order to reset (e.g., auto-zero) the column amplifier 204, the floating node "Vf" and output voltage Vout 226 are shorted together by turning the auto-zero switch 220 on. In this way, the floating node voltage Vf can be set to make input device 215 draws the same current as the current source device 210. At the same time, the output voltage Vout 226 is set to be the same as the floating node Vf. As such, the floating node Vf and the output voltage Vout 226 are reset to the gate source voltage Vgs of the input device 215 when its drain current is the same as the bias current "Ibias". Accordingly, the output voltage Vout 226 is reset to reset voltage "Vout rst" which can be written in equation (2) below.

$$Vrst=Vgs@Ibias=Vov@Ibias+Vth \quad (2)$$

where Vov is the over-driven voltage of the input device 215. As a result, when Vth is low, the reset voltage can be low and the open loop gain at the reset level can be low. However, a tradeoff with having a low Vth is that it makes it difficult to reduce the random telegraph signal (RTS) noise of the input device 215. In particular, the RTS noise of the input device 215 can cause vertical dot line on an output image of the image sensor, and so it is critical to image quality. Applying a low threshold voltage Vth device is an effective way to reduce RTS noise, but will reduce open loop gain as described previously.

Figure 4:
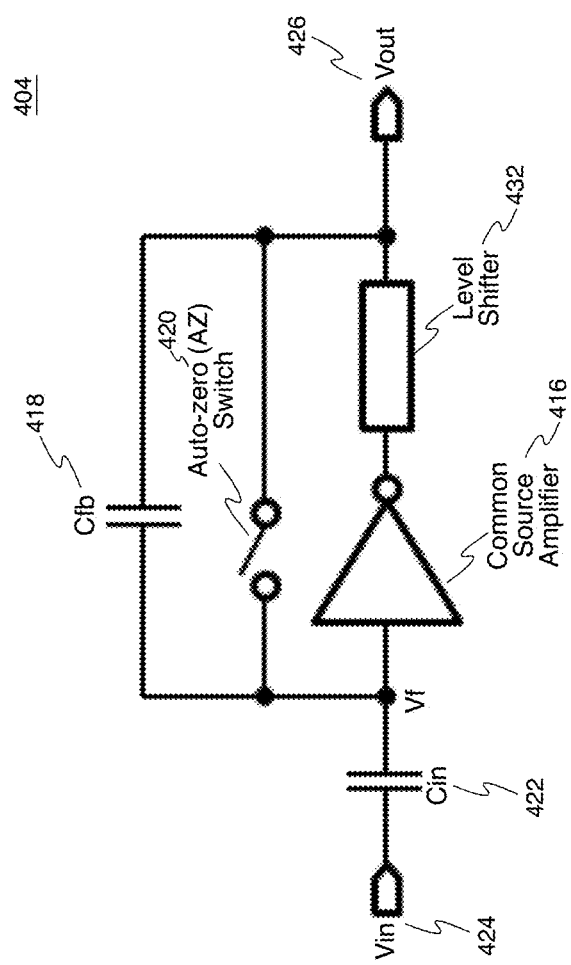
FIG. 4 illustrates an example of a column amplifier with a level shifter for use in an image sensor.

FIG. 4 illustrates another example of a column amplifier 404 with a level shifter that may be included in a CMOS image sensor, such as for example image sensor 100 of FIG. 1. As shown in the depicted example, column amplifier 404 includes a common source amplifier 416 coupled to receive an input voltage Vin 424 through an input capacitor Cin 422. An input of a level shifter 432 is coupled to the output of common source amplifier 416, and the output voltage Vout 426 is generated at an output of the level shifter 432. A feedback capacitor Cfb 418 is coupled between the floating voltage Vf input of the of the common source amplifier 416 and the output voltage Vout 426 at the output of the level shifter 432. In the example, an auto-zero switch 420 is also coupled between the floating voltage Vf input of the of the common source amplifier 416 and the output voltage Vout 426 at the output of the level shifter 432. In operation, the column amplifier 404 is coupled to be reset in response to closing or turning on the auto-zero switch 420.

It is appreciated that by including level shifter 432 in column amplifier 404 as shown in FIG. 4, the output voltage of the common source amplifier 416 after reset can be increased also. In this example, the output voltage of the common source amplifier 416 can be changed by the amount of voltage difference between input and output of the level shifter 432. For example, if the level shifter 432 shifts the voltage by "−Vlevel-shift", then the output of the common source amplifier 416 after reset is increased by "Vlevel-shift".

It is noted that in some examples a source follower amplifier can be used as the level shifter. However, in such an example, the voltage range is often reduced because amount of voltage shift is too large. Furthermore, it is noted that the power consumption with level shifters can be large in various examples.

Figure 5:
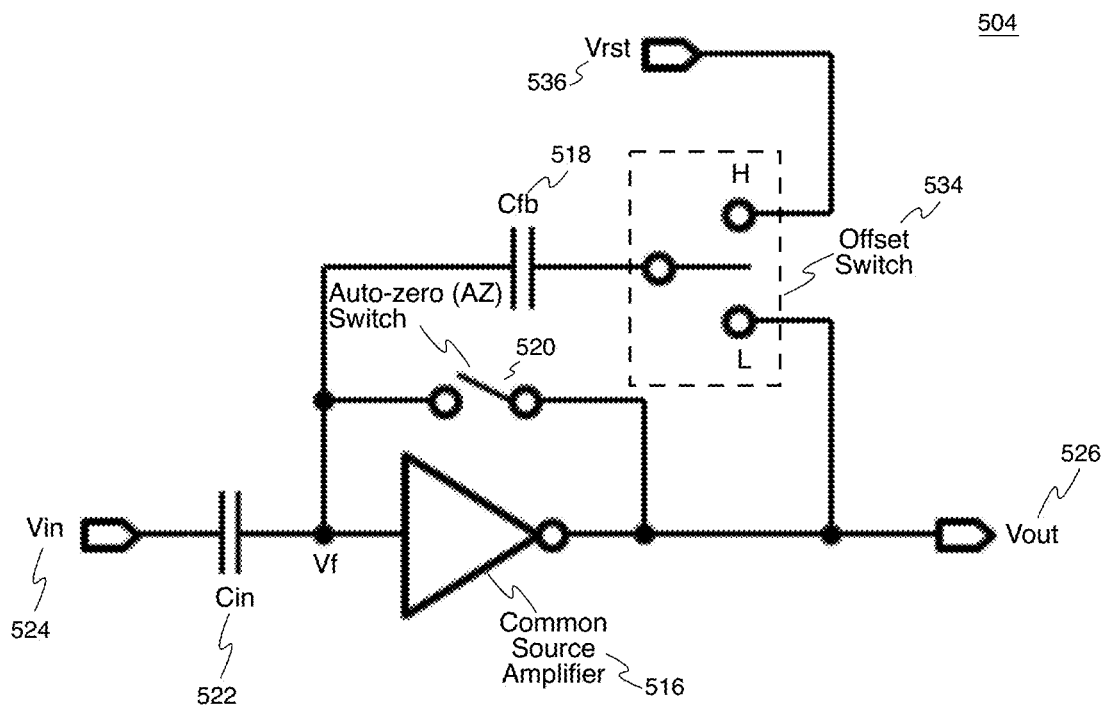
FIG. 5 illustrates a schematic of an example column amplifier with an offset generator for use in an image sensor in accordance with the teachings of the present invention.

FIG. 5 illustrates a schematic of an example column amplifier 504 with an offset generator in accordance with the teachings of the present invention that may be included in a CMOS image sensor, such as for example image sensor 100 of FIG. 1. As shown in the depicted example, column amplifier 504 includes a common source amplifier 516 coupled to receive an input voltage Vin 524. In the depicted example, common source amplifier 516 is capacitively coupled to receive the input voltage through an input capacitor Cin 522. In one example, the input voltage Vin 524 is representative of the image charge from a pixel cell of in the pixel array of the image sensor. In one example, the common source amplifier 516 includes an NMOS input device. In another example, it is appreciated that common source amplifier 516 may include PMOS input device. As shown in the depicted example, the output voltage Vout 526 is generated at the output of the common source amplifier 516. In the example, an auto-zero switch 520 is coupled between the floating voltage Vf input of the of the common source amplifier 516 and the output of the common source amplifier 516, which is coupled to the output voltage Vout 526 of the common source amplifier 516. In operation, the column amplifier 504 is coupled to be reset in response to closing or turning on the auto-zero switch 520.

As shown in the depicted example, a feedback capacitor Cfb 518 is coupled between the floating voltage Vf input of the of the common source amplifier 516 and an offset switch 534. In one example, the offset switch 534 is also coupled to reset voltage Vrst 536 and the output voltage Vout 526. In operation, offset switch 534 is configured to operate in either a first state (e.g., "H") or a second state (e.g., "L"). As such, the offset switch 534 is configured to couple the feedback capacitor Cfb 518 to the reset voltage 536 in response to the "H" setting, or the offset switch 534 is configured to couple the feedback capacitor Cfb 518 to the output voltage 526 in response to the "L" setting. Thus, it is appreciated that the output voltage Vout 526 can be adjusted by changing the connection of feedback capacitor Cfb 518 to either the reset voltage 534 or the output voltage 526 in response to the offset switch 534 in accordance with the teachings of the present invention.

Figure 6:
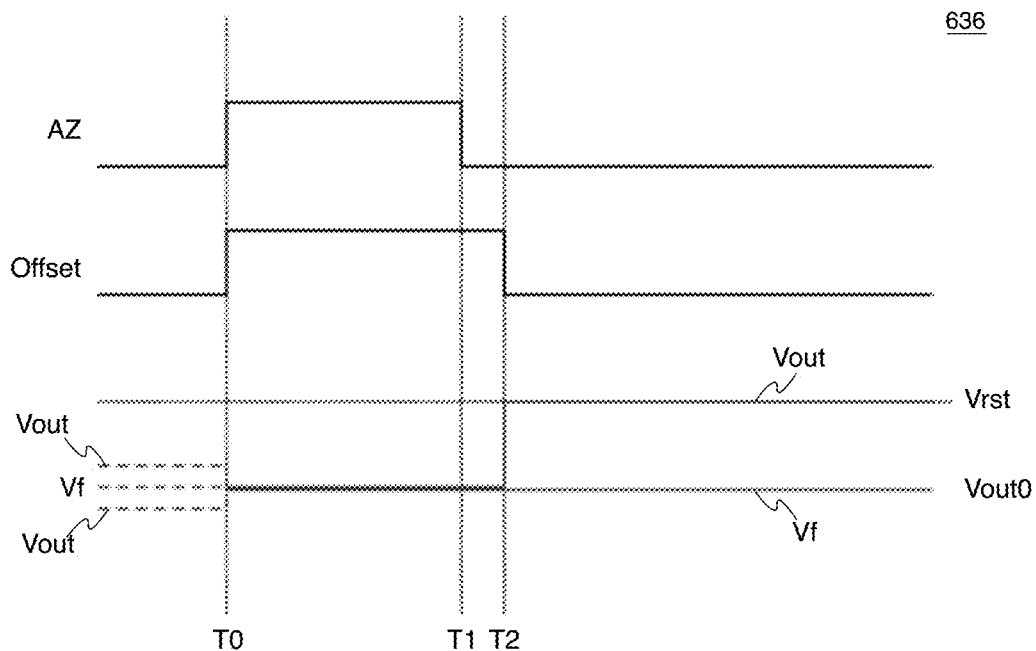
FIG. 6 illustrates an example timing diagram that shows examples of signals found in an example column amplifier with an offset generator for use in an image sensor during an auto-zero sequence in accordance with the teachings of the present invention.

To illustrate, FIG. 6 shows an example timing diagram 636 that shows examples of signals found in an example column amplifier during an auto-zero sequence in accordance with the teachings of the present invention. It is noted that column amplifier referred to in the timing diagram 636 of FIG. 6 may be an example of column amplifier 504 of FIG. 5, and that similarly named and numbered elements referenced below are coupled and function similar to as described above. In the example timing diagram 636 depicted in FIG. 6, the auto-zero switch 520 is controlled by signal "AZ" and offset switch 534 is controlled by the signal "Offset". In operation, the offset switch is configured to couple the capacitor Cfb 518 to the reset voltage Vrst 536 while the Offset signal is high (H) between time T0 and T2. The common source amplifier 516 is reset when the AZ signal is high, such that the reset voltage Vrst 536 is supplied to the capacitor Cfb 518 during reset. The AZ signal drops to low at time T1, and the Offset signal drops to low (L) at time T2, at which time the output voltage Vout 526 transitions from Vout0 to the reset voltage Vrst 536 after the reset operation is completed as shown. Thus, the auto-zero switch 520 and the offset switch 534 are configured to couple the feedback capacitor Cfb 518 to the reset voltage Vrst 536 during a reset of the column amplifier 504, and the offset switch 534 is further configured to couple the feedback capacitor Cfb 518 to the output voltage Vout 526 of the column amplifier 504 after the reset operation. In this way, the output voltage Vout 526 can be expressed as follows:

$$V_{out} = \frac{A\beta V_{rst} - V_{out0}}{A\beta + 1}, \quad (3)$$

$$\beta = \frac{Cfb}{Cin + Cfb} \quad (4)$$

where "-A" is open loop gain of the amplifier after reset and "Vout0" is Vout when "AZ" turns to low, and "β" is feedback factor. Thus, if the open loop gain is high enough, the output voltage Vout can be reset to Vrst.

Here, the open loop gain before applying the offset is not an issue if it is sufficient to boost the cascode device into deep saturation region. For example, when the target closed loop gain is 18 dB so that ratio between input capacitance "Cin" and feedback capacitance "Cfb" is 8 times, and the NMOS cascode device is operating in the linear region and the open loop gain is 24 dB, Vout will be expressed as follows:

$$V_{out} = \frac{A\beta V_{rst} - V_{out0}}{A\beta + 1} \approx \frac{\frac{16}{9} V_{rst} - V_{out0}}{\frac{16}{9} + 1} = 0.64 \cdot V_{rst}(-0.36 \cdot V_{out0}) \quad (5)$$

This is high enough to shift the output voltage Vout. It is appreciated that once the output voltage Vout is increased a little, the open loop gain of the amplifier is increased, and as a result, the output voltage Vout is closer to the reset voltage Vrst.

In this way, the output voltage Vout will be slightly different from the reset voltage Vrst because of finite open loop of the amplifier. Especially when the NMOS cascode device is in linear region before applying offset, the drain source voltage Vds of the input device will be changed, and this affects the error (Vout−Vrst). This error can be cancelled by correlated double sampling (CDS), which is often used in CMOS image sensors (CIS).

Figure 7:
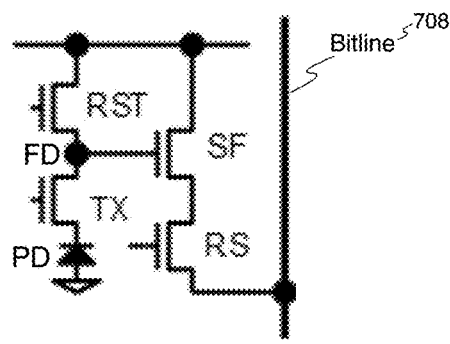
FIG. 7 illustrates a schematic of an example pixel cell included in a pixel array an image sensor in accordance with the teachings of the present invention.

FIG. 7 illustrates a schematic of an example pixel cell 738 included in a pixel array that may be included in a CMOS image sensor, such as for example image sensor 100 of FIG. 1. It is appreciated pixel cell 738 is an example of a 4T pixel cell and that other pixel cell arrangements may also be utilized in accordance with the teachings of the present invention. As shown, in the depicted example, pixel cell 738 includes a photodiode PD, which is adapted to photogenerate image charge in response to incident light. A transfer transistor TX is couple to transfer the photogenerated image charge from the photodiode PD to a floating diffusion in response to a transfer signal. A reset transistor RST is coupled to the floating diffusion FD to reset the floating diffusion in response to a reset signal. The floating diffusion FD is also coupled to the gate of a source follower coupled amplifier transistor SF, which is adapted to generate an image charge signal in response to the image charge in floating diffusion FD. A row select transistor RS is coupled to the source follower transistor SF to output the image charge signal from the pixel cell 738 to a column bitline 708 in response to a row select signal.

Figure 8:
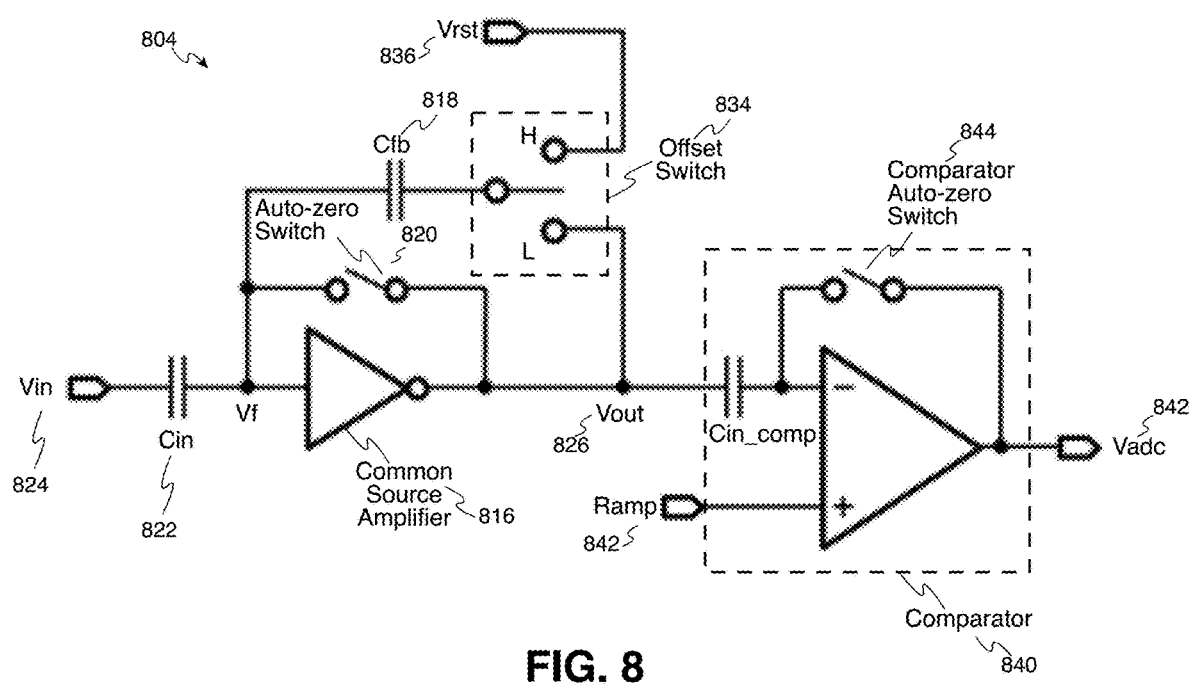
FIG. 8 illustrates an example schematic of a column amplifier with an offset generator and comparator for use in an image sensor in accordance with the teachings of the present invention.

FIG. 8 illustrates an example schematic of a column amplifier 804 with an offset generator and comparator 840 in accordance with the teachings of the present invention that may be included in a CMOS image sensor, such as for example image sensor 100 of FIG. 1. It is appreciated that the column amplifier 804 of FIG. 8 is similar to the column amplifier 504 depicted in FIG. 5. Accordingly, the details of column amplifier 804 of FIG. 8 will not be described again in detail for the sake of brevity. In addition, it is appreciated that column comparator 840 may be included in or utilized with an analog to digital converter (ADC), such as for example ADC 106 of FIG. 1. In one example, the ADC may be a single slope analog to digital converter to generate a digital representation of the image data read out from a pixel cell. In operation, the output voltage Vout 826 of column amplifier 804 is coupled to an input of comparator 840. Comparator 840 is coupled to compare the output voltage Vout 826 from the column amplifier 804 and the ramp signal Ramp 842. In the illustrated example, the error on the output voltage Vout 826 after reset of the amplifier 804 can be removed by resetting comparator 840 with the comparator auto-zero switch 844.

Figure 9:
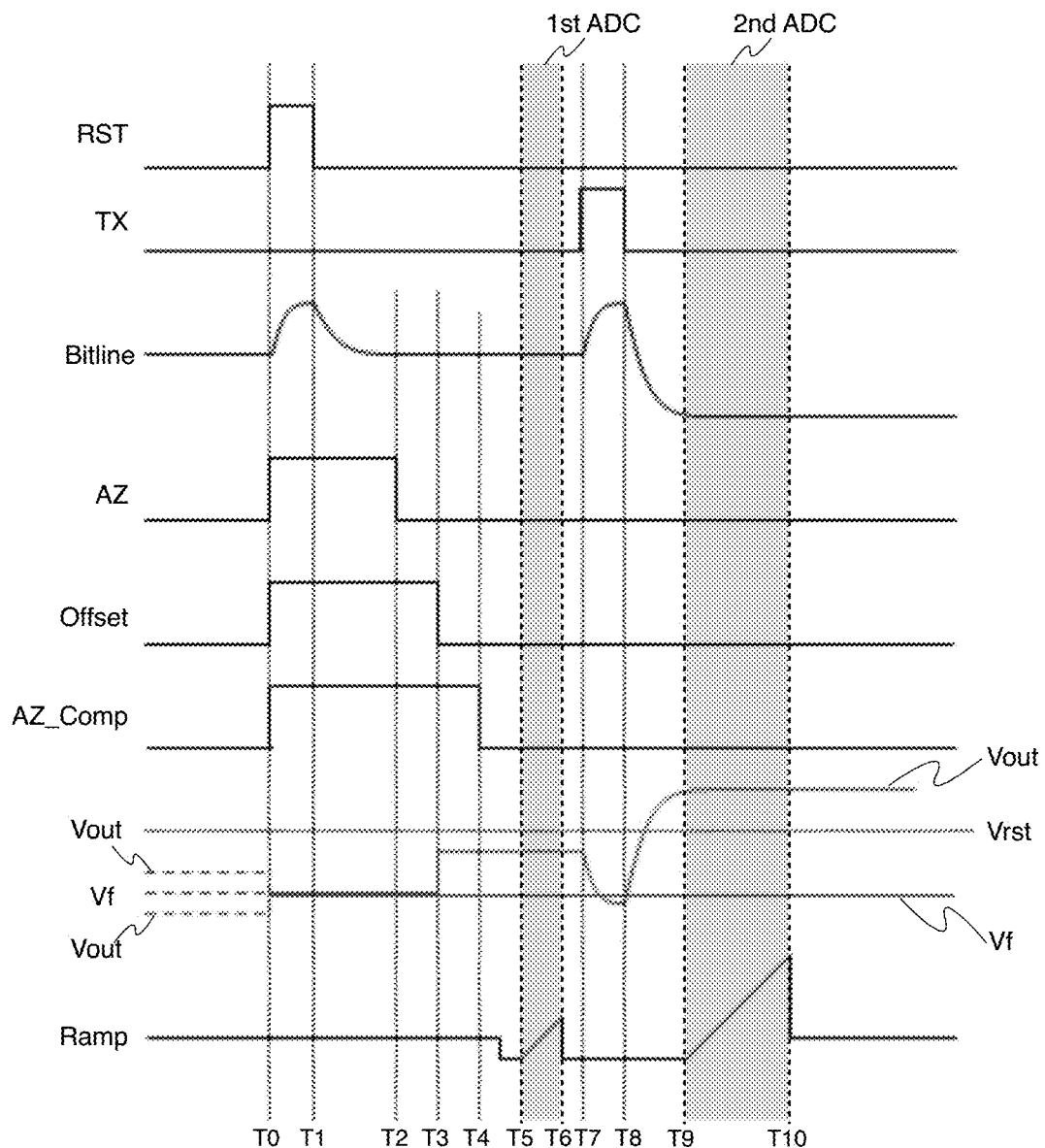
FIG. 9 illustrates an example timing diagram that shows examples of signals found in a column amplifier with an offset generator and comparator in accordance with the teachings of the present invention.

To illustrate, FIG. 9 shows an example timing diagram 946 that shows examples of signals found in a column amplifier with an offset generator and comparator in accordance with the teachings of the present invention. It is noted that column amplifier and comparator referred to in the timing diagram 946 of FIG. 9 may be an example of column amplifier 804 and comparator 840 of FIG. 8, and that similarly named and numbered elements referenced below are coupled and function similar to as described above. In the example timing diagram 946 depicted in FIG. 9, the comparator 840 of FIG. 8 can be reset by turning the comparator auto-zero switch 844 on. The comparator auto-zero switch 844 is controlled by signal AZ_Comp shown in FIG. 9. When the AZ_Comp signal is high at time T0, the comparator auto-zero switch 844 is turned on. As shown in FIG. 9, AZ_Comp transitions to low at time T4 after Offset signal is applied to Offset switch 834 from time T0 to time T3 to the Vout 826 output of the column amplifier 804 by switching the Offset signal low at time T3. In this way, the comparator 840 is reset to Vout 826 at time T3 after the Offset signal is applied to applied to Offset switch 834. The timing chart 946 example shown in FIG. 9 also illustrates digital correlated sampling (CDS) is also being applied. In the example, the first analog to digital conversion (1st ADC)

occurs between time T5 and time T6. In particular, the Ramp signal is shown ramping between time T5 and time T6, during which time a counter circuit in the analog to digital conversion circuit generates a digital representation of the reset signal output from the pixel. The second analog to digital conversion (2nd ADC) occurs between time T9 and time T10, during which time the Ramp signal ramps as shown and the counter circuit in the analog to digital conversion circuit generates the digital representation of the image signal output from the pixel. The difference between the 1st ADC and 2nd ADC may then be determined to cancel the remaining error in digital representation of the image signal output.

Figure 10:
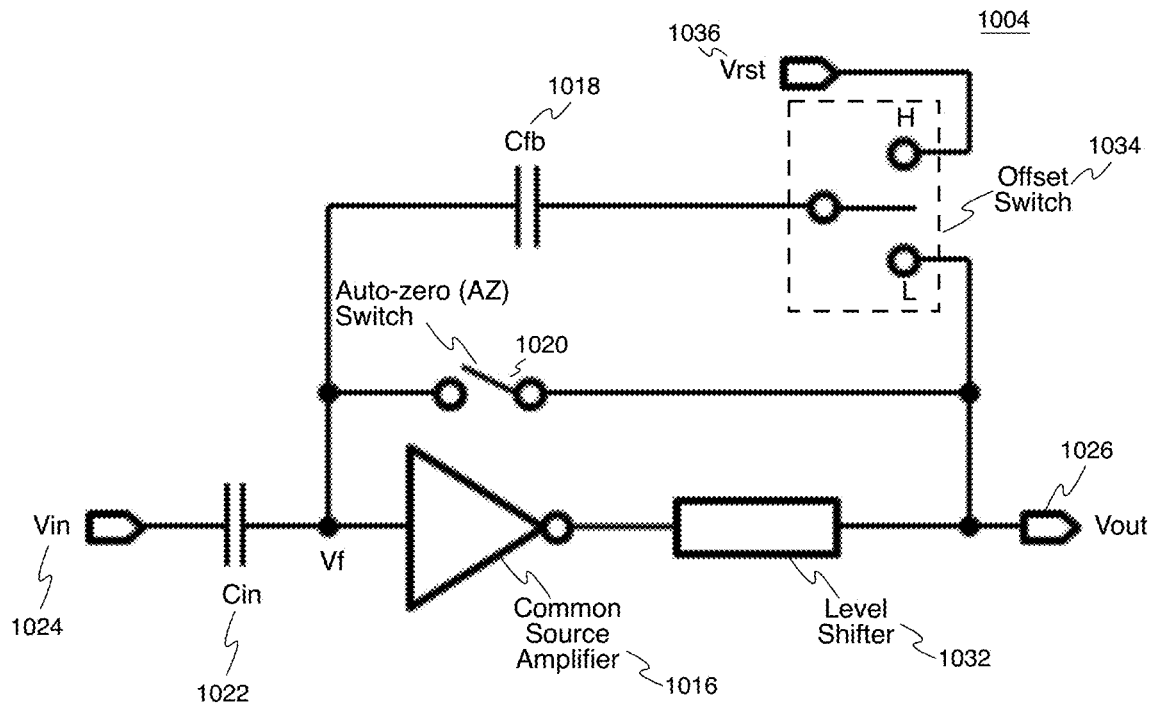
FIG. 10 illustrates a schematic of an example column amplifier with a level shifter and an offset generator for use in an image sensor in accordance with the teachings of the present invention.

FIG. 10 illustrates a schematic of an example column amplifier 1004 with a level shifter and an offset generator in accordance with the teachings of the present invention that may be included in a CMOS image sensor, such as for example image sensor 100 of FIG. 1. It is appreciated that the column amplifier 1004 of FIG. 10 may be another example of the column amplifier examples discussed previously, and that similarly named and numbered elements referenced below are coupled and function similar to as described above. For instance, column amplifier 1004 of FIG. 10 shares many similarities with the column amplifier 504 of FIG. 5. As shown, column amplifier 1004 includes a common source amplifier 1016 coupled to receive an input voltage Vin 1024 through an input capacitor Cin 1022. One difference between column amplifier 1004 of FIG. 10 and column amplifier 504 of FIG. 5 is that column amplifier 1004 of FIG. 10 also includes a level shifter 1032 coupled to the output of common source amplifier 1016. The output voltage Vout 1026 of column amplifier 1004 is generated at the output of the level shifter 1032. In the example, an auto-zero switch 1020 is coupled between the floating voltage Vf input of the of the common source amplifier 1016 and the output voltage Vout 1026 at the output of the level shifter 1032. In operation, the column amplifier 1004 is coupled to be reset in response to closing or turning on the auto-zero switch 1020.

As shown in the depicted example, a feedback capacitor Cfb 1018 is coupled between the floating voltage Vf input of the of the common source amplifier 1016 and an offset switch 1034. In one example, the offset is also coupled to reset voltage Vrst 1036 and the output voltage Vout 1026. In operation, offset switch 1034 is configured to operate in either a first state (e.g., "H") or a second state (e.g., "L"). As such, the offset switch 1034 is configured to couple the feedback capacitor Cfb 1018 to the reset voltage 1036 in response to the "H" setting, or the offset switch 1034 is configured to couple the feedback capacitor Cfb 1018 to the output voltage 1026 in response to the "L" setting. Thus, it is appreciated that the output voltage Vout 1026 can be adjusted by changing the connection of feedback capacitor Cfb 1018 to either the reset voltage 1034 or the output voltage 1026 in response to the offset switch 1034 in accordance with the teachings of the present invention.

In operation, the auto-zero sequence for column amplifier 1004 of FIG. 10 is the same as the auto-zero sequence described above with respect to timing diagram 636 of FIG. 6. However, with the inclusion of level shifter 1032 in column amplifier 1004 of FIG. 10, output voltage Vout 1026 during and after the auto-zero sequence is increased such that all devices in the common source amplifier 1016 can operate in deep saturation region. In this way, the open loop gain of column amplifier1004 during auto-zero can be 80~100 dB. After the auto-zero of the common source amplifier 1016, the offset switch 1034 is coupled to Vout 1026, so that output voltage Vout 1026 becomes almost the same as the reset voltage Vrst 1036. In this way, voltage range of column amplifier 1004 can be increased in accordance with the teachings of the present invention.

Figure 11:
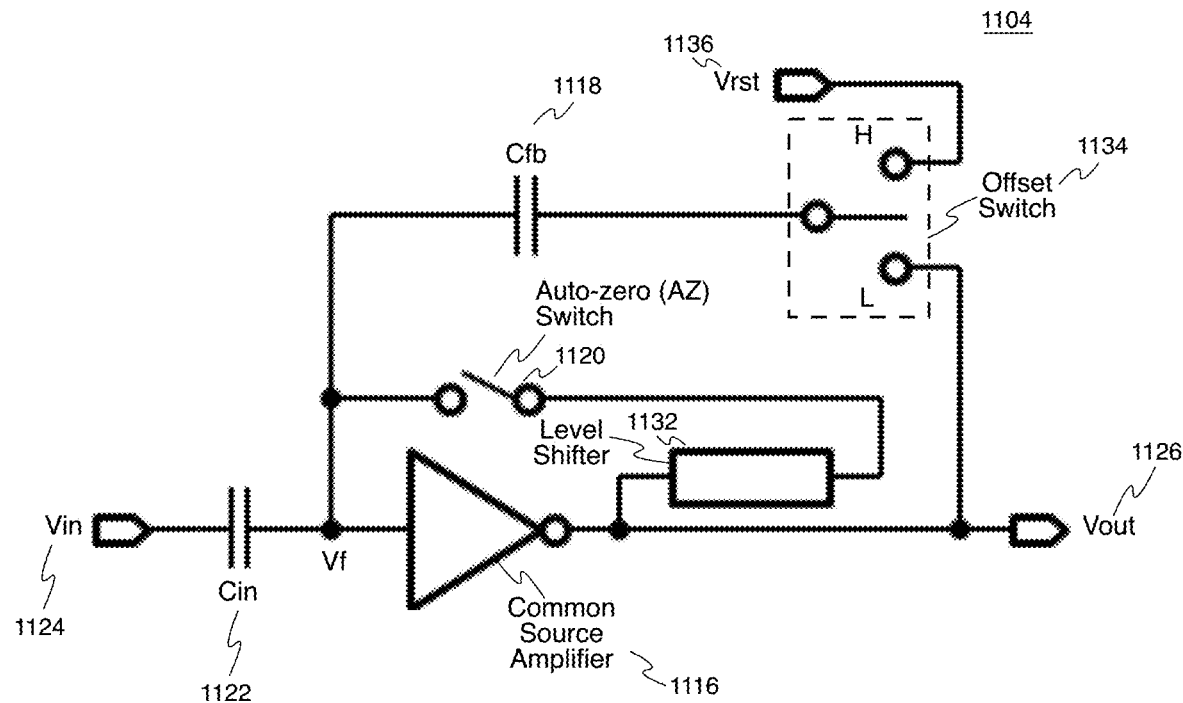
FIG. 11 illustrates a schematic of another example of a column amplifier with a level shifter and an offset generator for use in an image sensor in accordance with the teachings of the present invention.

FIG. 11 illustrates a schematic of another example of a column amplifier 1104 with a level shifter and an offset generator in accordance with the teachings of the present invention that may be included in a CMOS image sensor, such as for example image sensor 100 of FIG. 1. It is appreciated that the column amplifier 1104 of FIG. 11 may be another example of the column amplifier examples discussed previously, and that similarly named and numbered elements referenced below are coupled and function similar to as described above. For instance, column amplifier 1104 of FIG. 11 shares many similarities with the column amplifier 1004 of FIG. 10. As shown, column amplifier 1104 includes a common source amplifier 1116 coupled to receive an input voltage Vin 1124 through an input capacitor Cin 1122. Column amplifier 1104 also includes a level shifter 1132 coupled to the output of common source amplifier 1116. One difference between column amplifier 1104 of FIG. 11 and column amplifier 1004 of FIG. 10 is that in column amplifier 1104 of FIG. 11, the output voltage Vout 1126 of column amplifier 1104 is generated at the output of common source amplifier 1116, and the output of level shifter 1132 is coupled to auto-zero switch 1120 as shown. Thus, the auto-zero switch 1120 is coupled between the floating voltage Vf input of the of the common source amplifier 1116 and the output of the level shifter 1132.

In operation, the auto-zero sequence for column amplifier 1104 is the same as the auto-zero sequence described above with respect to timing diagram 636 of FIG. 6. The column amplifier 1104 is coupled to be reset in response to closing or turning on the auto-zero switch 1120. In addition, similar to column amplifier 1004 of FIG. 10, the open loop gain of column amplifier 1104 of FIG. 11 during auto-zero can be 80~100 dB with the inclusion of level shifter 1132 because the output voltage Vout 1126 during the auto-zero sequence can be increased such that all devices in the common source amplifier 1116 operate in the deep saturation region. In addition, after the auto-zero of the common source amplifier 1116, the offset switch 1134 is connected to Vout 1126, so that the output voltage Vout 1126 becomes almost the same as the reset voltage Vrst 1136. In this way, voltage range of column amplifier 1104 can be increased in accordance with the teaching of the present invention. Since the output of level shifter 1132 is coupled to the auto-zero switch 1120 and not coupled to the output of the Vout 1126 output of column amplifier 1104, the level shifter 1132 does not make noise worse. Furthermore, the level shifter 1132 can be powered down after auto-zero sequence because it is only used during the auto-zero of column amplifier 1104. Because the open loop gain of the common source amplifier 1104 can be as high as 80~100 dB, the error (Vout−Vrst) after auto-zero can be very small.

Figure 12:
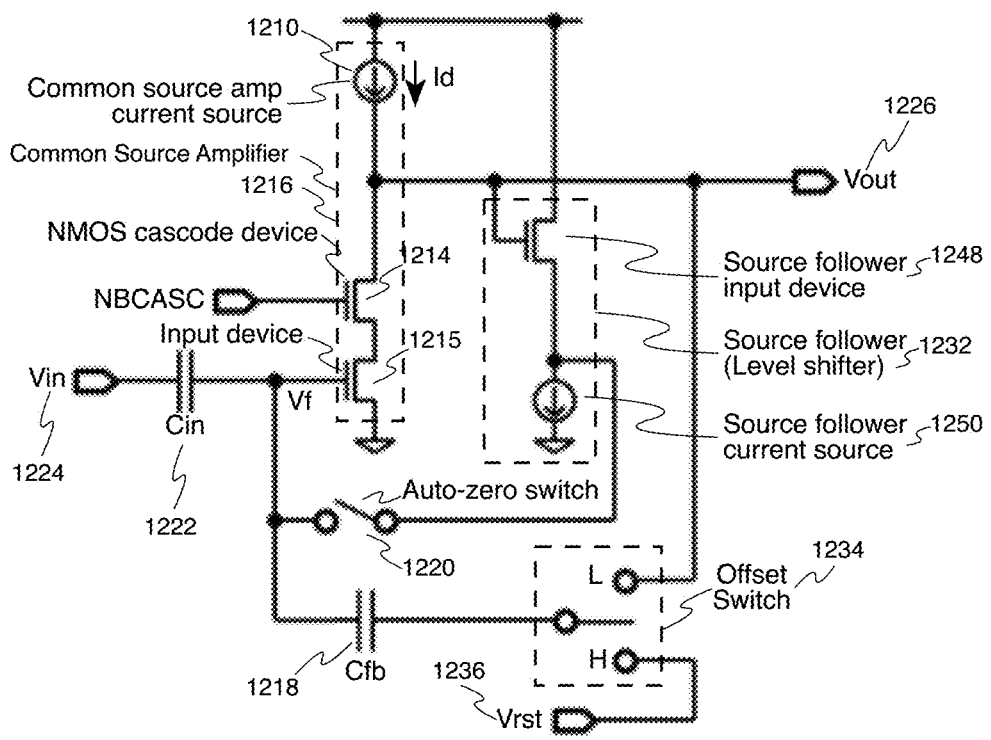
FIG. 12 illustrates a schematic of yet another example of a column amplifier with a level shifter and an offset generator for use in an image sensor in accordance with the teachings of the present invention.

FIG. 12 illustrates a schematic of yet another example of a column amplifier 1204 with a level shifter and an offset generator in accordance with the teachings of the present invention that may be included in a CMOS image sensor, such as for example image sensor 100 of FIG. 1. It is appreciated that the column amplifier 1204 of FIG. 12 may be another example of the column amplifier examples discussed previously, such as for instance column amplifier 1104 of FIG. 11, and that similarly named and numbered elements referenced below are coupled and function similar to as described above. However, FIG. 12 shows an example transistor level schematic of the column amplifier 1204 with level shifter. As shown in the depicted example, common source amplifier 1216 of column amplifier 1204 includes an input device 1215. In one example, input device 1215 is a transistor with a gate terminal coupled to receive an input voltage Vin 1224 through an input capacitor Cin 1222. In one example, input device 1215 is a source follower coupled transistor. As shown in the example, input device 1215 is coupled to an NMOS cascode device 1214, which is coupled between the Vout 1226 output of column amplifier 1204, and is coupled to current source 1210 to receive current Id as shown. NMOS cascode device 1214 is coupled to be biased with a bias signal NBCASC. Output voltage Vout 1226 is generated at a node between the NMOS cascode device 1214 and current source 1210.

As shown in the depicted example, a feedback capacitor Cfb 1218 is coupled between the floating voltage Vf input of the of input device 1215 and an offset switch 1234. In one example, the offset switch 1234 is also coupled to reset voltage Vrst 1236 and the output voltage Vout 1226. In operation, offset switch 1234 is configured to operate in either a first state (e.g., "H") or a second state (e.g., "L"). As such, the offset switch 1234 is configured to couple the feedback capacitor Cfb 1218 to the reset voltage 1236 in response to the "H" setting, or the offset switch 1234 is configured to couple the feedback capacitor Cfb 1218 to the output voltage 1326 in response to the "L" setting. Thus, it is appreciated that the output voltage Vout 1226 can be adjusted by changing the connection of feedback capacitor Cfb 1218 to either the reset voltage 1236 or the output voltage 1226 in response to the offset switch 1234 in accordance with the teachings of the present invention.

In the depicted example, column amplifier 1204 of FIG. 12 also includes a level shifter 1232 coupled between the Vout 1226 output of common source amplifier 1216 and an auto-zero switch 1220. The auto-zero switch 1220 is coupled between the floating voltage Vf input of the of the common source amplifier 1216 and the output of the level shifter 1232. In operation, the column amplifier 1204 is coupled to be reset in response to closing or turning on the auto-zero switch 1220. As shown in the depicted example, the level shifter 1232 includes a source follower 1248 that works as a level shifter. In the example, the source follower 1232 includes a current source 1250 as shown. In the example, the gate input of the source follower 1232 is coupled to the Vout 1226 output of the column amplifier 1204, and output of the source follower 1248 of level shifter 1232 is coupled to the auto-zero switch 1220.

Figure 13:
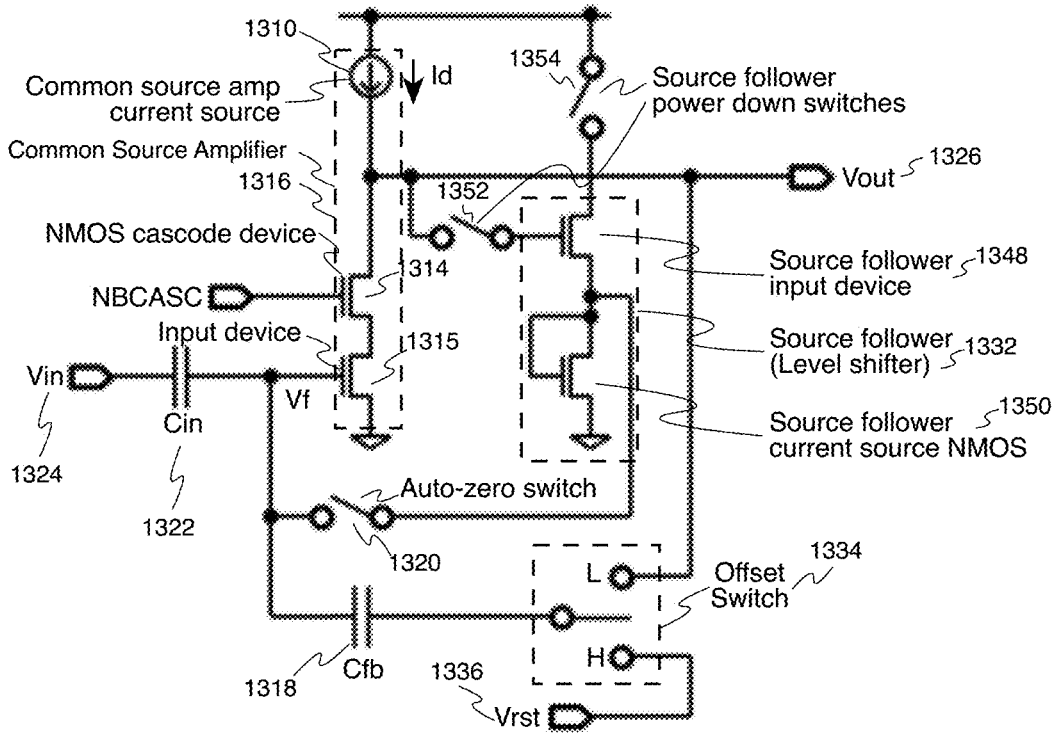
FIG. 13 illustrates a schematic of still another example of a column amplifier with a level shifter and an offset generator for use in an image sensor in accordance with the teachings of the present invention.

FIG. 13 illustrates a schematic of still another example of a column amplifier 1304 with a level shifter and an offset generator with a level shifter and an offset generator in accordance with the teachings of the present invention that may be included in a CMOS image sensor, such as for example image sensor 100 of FIG. 1. It is appreciated that the column amplifier 1304 of FIG. 13 may be still another example of the column amplifier examples discussed previously, and that similarly named and numbered elements referenced below are coupled and function similar to as described above. In particular, it is noted that the example circuitry illustrated in FIG. 13 shares many similarities with the example circuitry illustrated in FIG. 12, and that the elements in common between the example circuitry in FIG. 13 and FIG. 12 will not be described again in detail for the sake of brevity.

However, one difference between the example column amplifier 1304 illustrated in FIG. 13 and the example column amplifier 1204 in FIG. 12 is that in the example column amplifier 1304 illustrated in FIG. 13, the current source 1350 in the level shifter 1332 is shown being implemented as a source follower coupled NMOS current source coupled to source follower input device 1348. In other words, the source follower current source 1250 shown in FIG. 12 is replaced by a NMOS device 1350 in FIG. 13. The gate and drain of the NMOS device 1350 are coupled to the output of the source follower 1348. In this way, the source follower current source 1350 and the input device 1348 work as a current mirror (during the auto-zero sequence) so that current of the source follower is determined based on m, which is the W/L ratio between the input device 1315 and the source follower current source NMOS 1350 (e.g., $m=(W_{1315}/L_{1315})/(W_{1350}/L_{1350})$). As such, the floating voltage Vf and output voltage Vout 1326 are determined to make the drain current of the input device 1348 equal to "1/m" times of the current Id from current source 1310 because of the feedback loop that includes the source follower input device 1348, the source follower current source 1350, the input device 1315, the NMOS cascode device 1314, and the current source 1310. As such, the current consumption of the source follower current source 1350 can be determined by W/L ratio of the source follower current source 1350 and the input device 1315. For example, if the bias current of the common source amplifier 1310 is Id, and the W/L ratio of the source follower current source 1350 is 1/m of that of the input device 1315, the bias current of the source follower becomes Id/m.

Another difference between the example column amplifier 1304 illustrated in FIG. 13 and the example column amplifier 1204 in FIG. 12 is that column amplifier 1304 of FIG. 13 also includes source follower power down switches 1352 and 1354. As shown, a first power down switch 1352 is coupled between the Vout 1326 output of column amplifier 1304 and a gate terminal of the source follower input device 1348 of level shifter 1332. A second power down switch 1354 is coupled between a voltage supply rail and the drain terminal of source follower input device 1348 of level shifter 1332. In operation, the power down switches 1352 and 1354 can be turned off after an auto-zero sequence of column amplifier 1304. For instance, in one example, power down switches 1352 and 1354 can be coupled to be controlled in response to the Offset signal shown in timing diagram 636 of FIG. 6.

Figure 14:
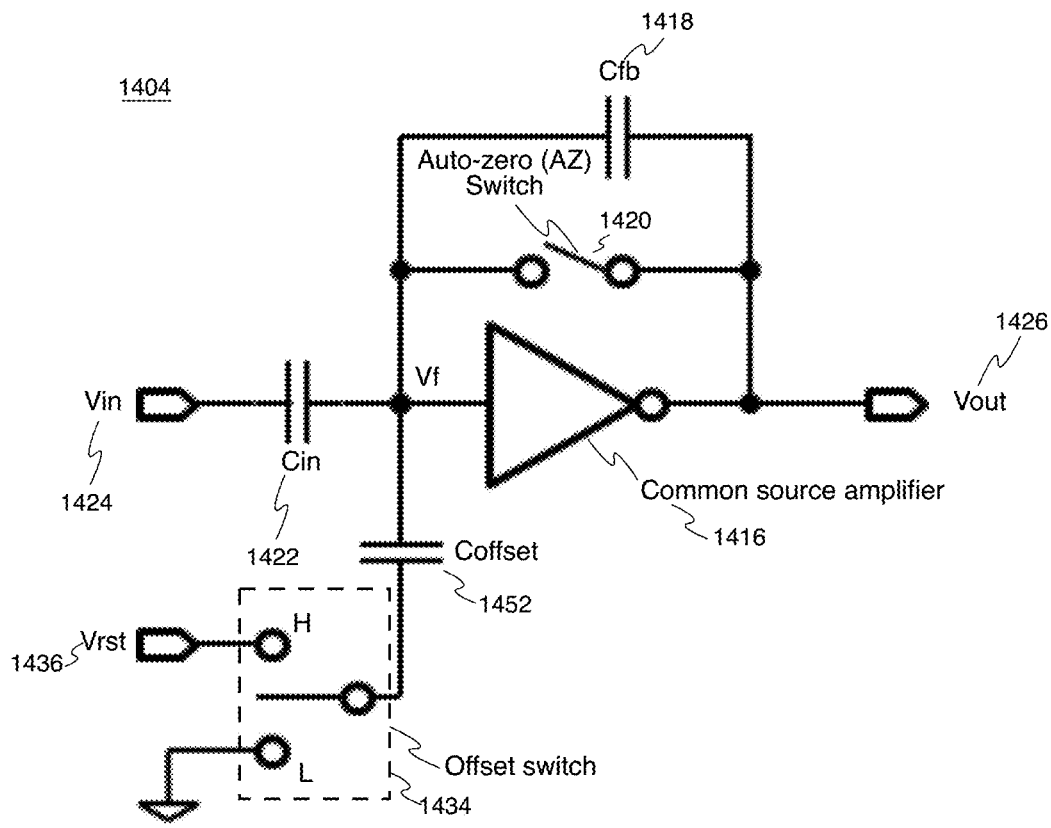
FIG. 14 illustrates schematic of another example of a column amplifier with an offset generator for use in an image sensor in accordance with the teachings of the present invention.

FIG. 14 illustrates a schematic of another example of a column amplifier 1404 with an offset generator in accordance with the teachings of the present invention that may be included in a CMOS image sensor, such as for example image sensor 100 of FIG. 1. It is appreciated that the column amplifier 1404 of FIG. 14 may be another example of the column amplifier examples discussed previously, and that similarly named and numbered elements referenced below are coupled and function similar to as described above. As shown, column amplifier 1404 includes a common source amplifier 1416 coupled to receive an input voltage Vin 1424 through an input capacitor Cin 1422. As shown in the depicted example, the output voltage Vout 1426 is generated at the output of the common source amplifier 1416.

In the example, a feedback capacitor Cfb 1418 is coupled between the floating voltage Vf input of the of the common source amplifier 1416 and the output voltage Vout 1426 at the output of the common source amplifier 1416. In addition, an auto-zero switch 1420 is coupled between the floating voltage Vf input of the of the common source amplifier 1416 and the output voltage Vout 1426 at the output of the common source amplifier 1416. In operation, the column amplifier 1404 is coupled to be reset in response to closing or turning on the auto-zero switch 1420.

In the depicted example, column amplifier 1404 includes a dedicated capacitor to add offset, Coffset 1452 coupled to the floating voltage Vf input of the common source amplifier 1416. In addition, an offset switch 1434 is coupled to the offset capacitor Coffset 1452. The offset switch 1434 is also coupled to reset voltage Vrst 1436 and ground. The offset switch 1434 is configured to operate in either a first state (e.g., "H") or a second state (e.g., "L"). As such, the offset switch 1434 is configured to couple the offset capacitor Coffset 1418 to the reset voltage 1436 in response to the "H" setting, or the offset switch 1434 is configured to couple the offset capacitor Coffset 1452 to ground in response to the "L" setting.

Figure 15:
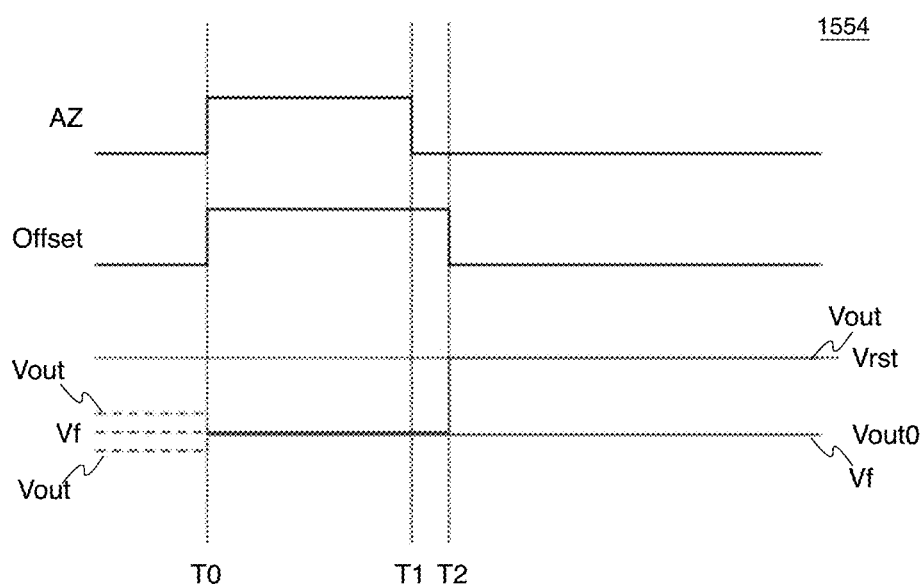
FIG. 15 illustrates another example timing diagram that shows examples of signals found in an example column amplifier with an offset generator for use in an image sensor during an auto-zero sequence in accordance with the teachings of the present invention.

To illustrate, FIG. 15 shows an example timing diagram 1554 that shows examples of signals found in an example column amplifier with offset during an auto-zero sequence in accordance with the teachings of the present invention. It is noted that column amplifier referred to in the timing diagram 1554 of FIG. 15 may be an example of column amplifier 1404 of FIG. 14, and that similarly named and numbered elements referenced below are coupled and function similar to as described above. In the depicted example, the auto-zero switch 1420 and the offset switch 1434 of FIG. 14 are controlled by AZ signal and the Offset signal of FIG. 15, respectively. Thus, as shown in FIG. 15, one terminal of the offset capacitor Coffset 1452 is charged with the reset voltage Vrst 1436 during a reset operation when the Offset signal and the AZ signal are high after time T0. After the reset operation, the terminal of the offset capacitor Coffset 1452 is then coupled to ground. As such, the output voltage Vout 1426 is boosted with the operating point of the column amplifier 1404 being adjusted as shown in accordance with the teachings of the present invention. The output voltage Vout 1426 after applying the offset is given by the equation below:

$$Vout = Vout0 + \frac{Coffset}{Cfb - \frac{Cin + Cfb + Coffset}{A}} \cdot Vrst \quad (6)$$

Figure 16:
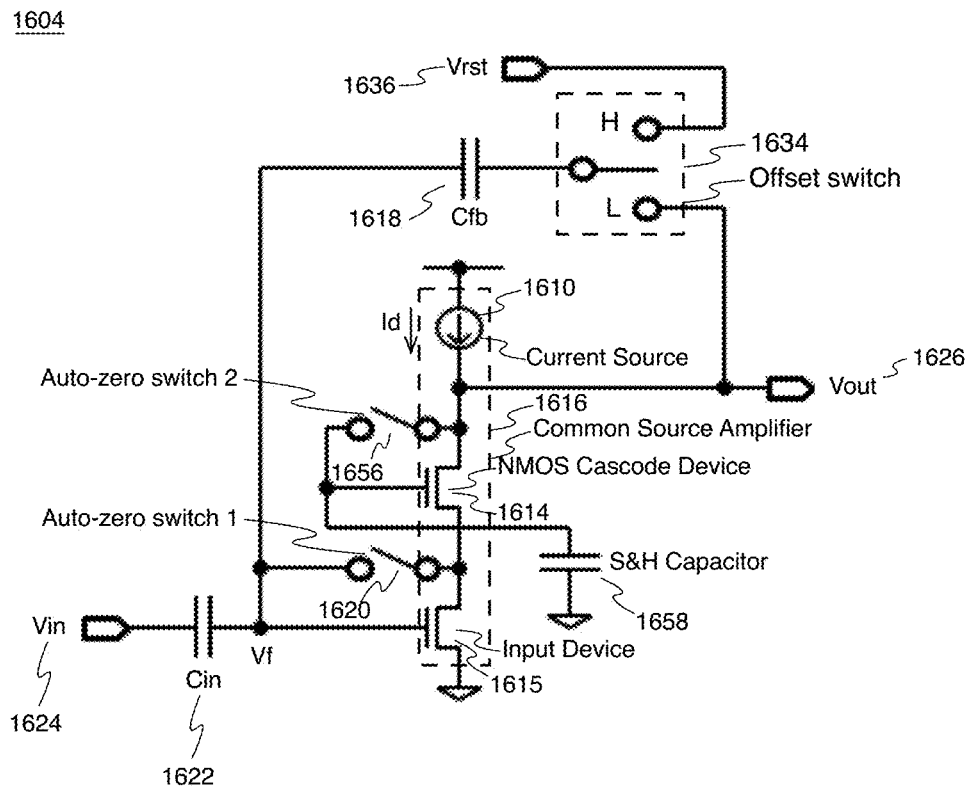
FIG. 16 illustrates schematic of an example of a column amplifier with an offset generator and two auto-zero switches for use in an image sensor in accordance with the teachings of the present invention.

FIG. 16 illustrates schematic of an example of a column amplifier 1604 with an offset generator and two auto-zero switches for use in an image sensor in accordance with the teachings of the present invention. It is appreciated that the column amplifier 1604 of FIG. 16 shares similarities with several of the column amplifier examples discussed previously, and that similarly named and numbered elements referenced below are coupled and function similar to as described above. However, FIG. 16 shows an example transistor level schematic of the column amplifier 1604 with two auto zero switches 1620 and 1656, and a sample and hold (S&H) capacitor 1658. In addition, it is appreciated that example column amplifier 1604 of FIG. 16 does not have a level shifter, as was included in several of the previous examples. As such, column amplifier 1604 benefits with smaller size without including a level shifter.

As shown in the depicted example, column amplifier 1604 includes a common source amplifier 1616 that includes an input device 1615. In one example, input device 1615 is a transistor with a gate terminal coupled to receive an input voltage Vin 1624 through an input capacitor Cin 1622. As shown in the example, input device 1615 is coupled to an NMOS cascode device 1614, which is coupled between the Vout 1626 output of column amplifier 1604, and is coupled to current source 1610 to receive current Id as shown.

Output voltage Vout 1626 is generated at a node between the NMOS cascode device 1614 and current source 1610.

As shown in the depicted example, a feedback capacitor Cfb 1618 is coupled between the floating voltage Vf input of the of input device 1615 and an offset switch 1634. In one example, the offset switch 1634 is also coupled to reset voltage Vrst 1636 and the output voltage Vout 1626. In operation, offset switch 1634 is configured to operate in either a first state (e.g., "H") or a second state (e.g., "L"). As such, the offset switch 1634 is configured to couple the feedback capacitor Cfb 1618 to the reset voltage 1636 in response to the "H" setting, or the offset switch 1634 is configured to couple the feedback capacitor Cfb 1618 to the output voltage 1626 in response to the "L" setting. Thus, in one example, the offset switch 1634 couples the feedback capacitor Cfb 1618 to Vrst 1636 during a reset operation, and couples the feedback capacitor Cfb 1618 to the output voltage Vout 1626 after a reset operation. In this way, the output voltage Vout 1626 of the amplifier can be reset to almost same voltage as Vrst 1636.

As mentioned, column amplifier 1604 of FIG. 16 also includes two auto-zero switches 1620 and 1656, and a sample and hold (S&H) capacitor 1658. Auto-zero switch 1 1620 is coupled between a gate terminal and a drain terminal of input device 1615, and auto-zero switch 2 1656 is coupled between a gate terminal and a drain terminal of NMOS cascode device 1614. During reset, both auto-zero switch 1 1620 and auto-zero switch 2 1656 are turned on and the gate voltage of the input device 1615 and the NMOS cascode device 1614 are automatically adjusted to make the drain current of both devices same as the Id current. In this way, both of the input device 1615 and NMOS cascode device 1614 operate in saturation region because the gate-source voltage and drain-source voltage become same. In this way, the open loop gain of the amplifier can be 80~100 dB as described previously. After a reset operation, both of auto-zero switch 1 1620 and auto-zero switch 2 1656 are turned off. The gate voltage of the NMOS cascode device 1614 is maintained by the S&H capacitor 1656, which is coupled the gate terminal of the NMOS cascode device 1614. In various examples, the S&H capacitor 1656 may be comprised of a capacitive device, such as MOS capacitor, MOM or MIN capacitor, or metal parasitic capacitance.

Figure 17:
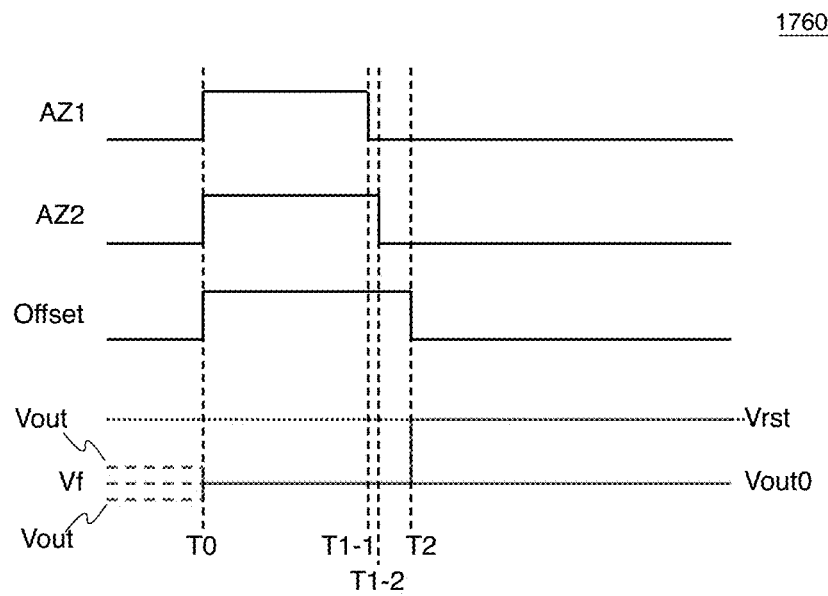
FIG. 17 illustrates an example timing diagram that shows examples of signals found in an example column amplifier with an offset generator and two offset switches for use in an image sensor during an auto-zero sequence in accordance with the teachings of the present invention.

To illustrate, FIG. 17 illustrates an example timing diagram 1760 that shows examples of signals found in an example column amplifier with an offset generator and two offset switches, as illustrated for example in FIG. 16, for use in an image sensor during an auto-zero sequence in accordance with the teachings of the present invention. For instance, the signal "AZ1" controls auto-zero switch 1 1620, and the signal "AZ2" controls auto-zero switch 2 1656. In operation, when AZ1 and AZ2 are high, auto-zero switches 1620 and 1656 are turned on, and when AZ1 and AZ2 are low, auto-zero switches 1620 and 1656 are turned off.

As shown in the depicted example, a reset operation begins at time T0, at which time AZ1 turns on auto-zero switch 1 1620, AZ2 turns on auto-zero switch 2 1656, and the Offset signal couples the feedback capacitor Cfb 1618 to the reset voltage Vrst 1636 through the offset switch 1634. At time T1-1, the AZ1 signal turns off auto-zero switch 1 1620, and at time T1-2, the AZ2 signal turns off auto-zero switch 2 1656. At time T2, the Offset signal couples the feedback capacitor Cfb 1618 to be coupled to the Vout 1626 terminal, which causes the output voltage Vout 1626 to be equal to the reset voltage Vrst 1636 at time T2. Thus, similar to other examples, the offset switch 1634 is coupled to the reset voltage Vrst 1636 when the auto-zero switches 1620 and 1656 are turned on, and connected to the output voltage Vout 1626 after the auto-zero switches 1620 and 1656 are turned off In this way, the output Vout 1626 of the amplifier 1604 can be reset to the reset voltage Vrst 1636.

It is noted that in one example, auto-zero switch 1 1620 and auto-zero switch 2 1656 are ideally turned off at the same time. If one of them is turned off earlier than the other, then the voltage sampled and held on the floating nodes, Vf, and the gate of the NMOS cascode device 1614 will be altered. When auto-zero switches 1620 and 1656 are turned off, the voltage on the floating nodes will be changed a little by charge injection and/or feed through. In addition, the drain current will be also changed because gate voltage is changed.

For instance, in one example, if auto-zero switch 1 1620 is turned off earlier, the drain current of the input device 1615 will be changed before auto-zero switch 2 1656 is turned off. Because current from the current source 1610 and the input device 1615 (and the NMOS current source) are different, the output voltage Vout 1626 changes with time. If the timing difference between time T1-1 and time T1-2 is small, and the voltage difference in Vout 1626 is small, then this is acceptable. To make the voltage difference small, the bandwidth of Vout 1626 during this period should be small enough compared with the timing difference. To make the bandwidth small enough, the loading on Vout 1626 should be large or the S&H capacitor 1658 for the NMOS cascode device 1614 should be large since this capacitor is connected to Vout 1626 during this period.

In another example, if the auto-zero switch 2 1656 is turned off earlier, then drain current of the NMOS cascode device 1614 is disturbed by charge injection and feed through and output voltage Vout 1626 will be changed with time. In this example, if the current source and the NMOS cascode device 1614 operate in saturation region, then the source voltage of the NMOS cascode device 1614 is changed depending on the gm ratio between the NMOS cascode device 1614 and the input device 1615 and the amount of the charge injection and feed though. As such, some part of the voltage offset by turning off the auto-zero switch 2 changes Vf, which contributes to the amp offset voltage. In the example, the auto-zero switch 1 1620 is to be turned off before one of devices go into linear region, otherwise the drain current of the cascode device 1614 is changed, which affects the voltage of Vf. Thus, the timing difference between time T1-1 and time T1-2 should be small enough compared with delay of the amplifier.

One effective way to reduce charge injection when auto-zero switches are turned off is to reduce slew rate of control signals. However, if the slew rate is reduced, skew and the timing difference can be increased. Thus, there is a trade off between the charge injection amount and timing difference, both of which affect the offset voltage of the amplifier.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An amplifier circuit for use in an image sensor, comprising:
   a common source amplifier coupled to receive an input signal representative of an image charge from a pixel cell of the image sensor;
   an auto-zero switch coupled between an input of the common source amplifier and an output of the common source amplifier;
   a feedback capacitor coupled to the input of the common source amplifier;
   an offset switch coupled to the feedback capacitor, wherein the offset switch is further coupled to a reset voltage and an output of the amplifier circuit, wherein the auto-zero switch and the offset switch are configured to couple the feedback capacitor to the reset voltage during a reset operation of the amplifier circuit, and wherein the offset switch is configured to couple the feedback capacitor to the output of the amplifier circuit after the reset operation of the amplifier circuit
   a level shifter coupled between the output of the common source amplifier and the auto-zero switch, wherein the level shifter comprises a source follower input device having an input coupled to the output of the amplifier circuit and a current source coupled to the source follower input device, wherein the current source comprises a source follower current source;
   a first power down switch coupled between the output of the amplifier circuit and a gate terminal of the source follower input device; and
   a second power down switch coupled between a voltage supply rail and a drain terminal of the source follower input device.

2. The amplifier circuit of claim 1, wherein the common source amplifier is capacitively coupled to receive an input signal through an input capacitor.

3. The amplifier circuit of claim 1, wherein the auto-zero switch is configured to be turned on at a same time at a beginning of the reset operation as the offset switch is configured to be switched into a first state to couple the feedback capacitor to the reset voltage.

4. The amplifier circuit of claim 1, wherein the output of common source amplifier is the output of the amplifier circuit.

5. The amplifier circuit of claim 1, wherein the output of the amplifier circuit is coupled to an input of a comparator.

6. The amplifier circuit of claim 1, wherein an output of the level shifter is coupled to the output of the amplifier circuit, the offset switch, and the auto-zero switch.

7. The amplifier circuit of claim 1, wherein an output of the level shifter is coupled to the auto-zero switch, wherein the output of the common source amplifier is the output of the amplifier circuit, and wherein the output of the common source amplifier is coupled to an input of the level shifter and offset switch.

8. A method for amplifying an input signal in an image sensor, comprising:
   receiving the input signal at an input of a common source amplifier, wherein the input signal is representative of an image charge from a pixel cell of the image sensor;
   coupling an auto-zero switch between the input of the common source amplifier and an output of the common source amplifier;

coupling a feedback capacitor between the input of the common source amplifier and the output of the common source amplifier;
coupling an offset capacitor to the input of the common source amplifier;
coupling an offset switch coupled to the offset capacitor, to a reset voltage, and to ground;
turning on the auto-zero switch during a reset operation of an amplifier circuit
coupling the offset capacitor to the reset voltage through the offset switch while the auto-zero switch is turned on during the reset operation of the amplifier circuit;
turning off the auto-zero switch after the reset operation of the amplifier circuit and
coupling the offset capacitor to the ground through the offset switch while the auto-zero switch is turned off after the reset operation of the amplifier circuit.

9. The method of claim 8, wherein the common source amplifier is capacitively coupled to receive the input signal through an input capacitor.

10. The method of claim 8, wherein said turning on the auto-zero switch during the reset operation of the amplifier circuit comprises turning on the auto-zero switch at a same time at a beginning of the reset operation as the offset switch is configured to be switched into a first state to couple the feedback capacitor to the reset voltage.

11. The method of claim 8, wherein the output of common source amplifier is an output of the amplifier circuit.

12. An imaging system, comprising:
a pixel array including a plurality of pixel cells;
a column amplifier circuitry coupled to the pixel array to read out image charge information from the pixel array, wherein the column amplifier circuitry comprises:
  a common source amplifier coupled to receive an input signal representative of the image charge information from one of the pixel cells of the pixel array, wherein the common source amplifier comprises:
    a transistor having a gate coupled to receive the input signal and a source coupled to ground;
    a cascode device coupled between a drain of the transistor and the output of the column amplifier circuitry; and
    a current source coupled to the cascode device;
  a first auto-zero switch coupled between an input of the common source amplifier and an output of the common source amplifier, wherein the first auto-zero switch is further coupled between a gate of the transistor and a drain of the transistor;
  a second auto-zero switch coupled between a gate of the cascode device and a drain of the cascode device;
  a sample and hold capacitor coupled to the gate of the cascode device;
  a feedback capacitor coupled to the input of the common source amplifier; and
  an offset switch coupled to the feedback capacitor, wherein the offset switch is further coupled to a reset voltage and an output of the column amplifier circuitry, wherein the auto-zero switch and the offset switch are configured to couple the feedback capacitor to the reset voltage during a reset operation of the column amplifier circuitry, and wherein the offset switch is configured to couple the feedback capacitor to the output of the column amplifier circuitry after the reset operation of the column amplifier circuitry.

13. The imaging system of claim 12, further comprising comparator coupled to an output of the column amplifier circuitry.

14. The imaging system of claim 12, wherein the comparator is included in an analog to digital converter coupled to the column amplifier circuitry.

15. The imaging system of claim 12, wherein the common source amplifier is capacitively coupled to receive an input signal through an input capacitor.

16. The imaging system of claim 12, wherein the auto-zero switch is configured to be turned on at a same time at a beginning of the reset operation as the offset switch is configured to be switched into a first state to couple the feedback capacitor to the reset voltage.

17. The imaging system of claim 12, wherein the output of common source amplifier is the output of the column amplifier circuitry.

18. The imaging system of claim 12, wherein an output of the level shifter is coupled to the output of the column amplifier circuitry, the offset switch, and the auto-zero switch.

19. The imaging system of claim 12, wherein an output of the level shifter is coupled to the auto-zero switch, wherein the output of the common source amplifier is the output of the column amplifier circuitry, and wherein the output of the common source amplifier is coupled to an input of the level shifter and offset switch.

20. An amplifier circuit for use in an image sensor, comprising:
a common source amplifier coupled to receive an input signal representative of an image charge from a pixel cell of the image sensor, wherein the common source amplifier comprises:
  a transistor having a gate coupled to receive the input signal and a source coupled to ground;
  a cascode device coupled between the transistor and the output of the amplifier; and
  a current source coupled to the cascode device;
a first auto-zero switch coupled between an input of the common source amplifier and an output of the common source amplifier, wherein the auto-zero switch is further coupled between the gate of the transistor and a drain of the transistor;
a second auto-zero switch coupled between a gate of the cascode device and a drain of the cascode device;
a sample and hold capacitor coupled to the gate of the cascode device;
a feedback capacitor coupled to the input of the common source amplifier;
an offset switch coupled to the feedback capacitor, wherein the offset switch is further coupled to a reset voltage and an output of the amplifier circuit, wherein the auto-zero switch and the offset switch are configured to couple the feedback capacitor to the reset voltage during a reset operation of the amplifier circuit, and wherein the offset switch is configured to couple the feedback capacitor to the output of the amplifier circuit after the reset operation of the amplifier circuit.

21. An imaging system, comprising:
a pixel array including a plurality of pixel cells;
a column amplifier circuitry coupled to the pixel array to read out image charge information from the pixel array, wherein the column amplifier circuitry comprises:
  a common source amplifier coupled to receive an input signal representative of the image charge information from one of the pixel cells of the pixel array;
  an auto-zero switch coupled between an input of the common source amplifier and an output of the common source amplifier;

a feedback capacitor coupled to the input of the common source amplifier;

an offset switch coupled to the feedback capacitor, wherein the offset switch is further coupled to a reset voltage and an output of the column amplifier circuitry, wherein the auto-zero switch and the offset switch are configured to couple the feedback capacitor to the reset voltage during a reset operation of the column amplifier circuitry, and wherein the offset switch is configured to couple the feedback capacitor to the output of the column amplifier circuitry after the reset operation of the column amplifier circuitry;

a level shifter coupled between the output of the common source amplifier and the auto-zero switch, wherein the level shifter comprises a source follower input device having an input coupled to the output of the column amplifier circuitry and a current source coupled to the source follower input device, wherein the current source comprises a source follower current source;

a first power down switch coupled between the output of the column amplifier circuitry and a gate terminal of the source follower input device; and a second power down switch coupled between a voltage supply rail and a drain terminal of the source follower input device.

* * * * *